United States Patent

Abbott et al.

Patent Number: 5,081,389
Date of Patent: Jan. 14, 1992

[54] CRYSTAL CUT ANGLES FOR LITHIUM TANTALATE CRYSTAL FOR NOVEL SURFACE ACOUSTIC WAVE DEVICES

[75] Inventors: Benjamin P. Abbott; Thor Thorvaldsson, both of Zürich, Switzerland

[73] Assignee: Ascom Zelcom AG., Hombrechtikon, Switzerland

[21] Appl. No.: 620,025

[22] Filed: Nov. 30, 1990

[51] Int. Cl.$^5$ .............................................. H01L 41/08
[52] U.S. Cl. ................................. 310/313 A; 310/360; 252/62.9; 29/25.35
[58] Field of Search ......................... 310/313 A, 360; 29/25.35; 252/62.9

[56] References Cited

U.S. PATENT DOCUMENTS

| | | | |
|---|---|---|---|
| 3,644,761 | 2/1972 | Doi et al. | 310/360 |
| 4,001,767 | 1/1977 | Slobodnik, Jr. | 310/313 A |
| 4,159,435 | 6/1979 | Lewis | 310/313 A |
| 4,245,200 | 1/1981 | Takahashi et al. | 310/313 A |
| 4,489,250 | 12/1984 | Ebata et al. | 310/313 A |
| 4,755,314 | 7/1988 | Sakaguchi | 310/360 X |

Primary Examiner—Mark O. Budd
Attorney, Agent, or Firm—Brady, O'Boyle & Gates

[57] ABSTRACT

A Lithium Tantalate crystal, defined by the Euler angles lambda ($\lambda$) equal to about 0° and mu ($\mu$) equal to about 90° with an acoustic wave propagation direction angle theta ($\theta$) in the range of plus 130° to plus 150° and preferably equal to about plus 141.25°, offers unique properties for surface acoustic wave device applications.

12 Claims, 2 Drawing Sheets

CRYSTAL CUT ANGLES FOR LITHIUM TANTALATE CRYSTAL FOR NOVEL SURFACE ACOUSTIC WAVE DEVICES

BACKGROUND OF THE INVENTION

This invention relates to an optimal acoustic wave propagation orientation on a Lithium Tantalate crystal for surface acoustic wave (SAW) applications including natural single-phase unidirectional transducers. SAW devices are used for a large number of applications including impedance elements, resonators, coupled resonator filters, transversal filters, and the like.

Surface acoustic wave technology for signal processing has produced a broad range of devices which are typically used in the VHF and UHF range and include filters, resonators, delay lines, convolvers, impedance elements and various other types of devices. Processes for preparing these devices are well known in the art and the devices typically involve interdigitated electrodes.

The orientations for surface acoustic wave propagation for any given crystal are completely defined by the Euler angles, lambda, mu and theta. The first two angles lambda and mu, define the crystal cut and the third angle, theta defines the direction of acoustic wave propagation in that cut. Thus, acoustic wave propagation orientation in the crystal is defined by a unique set of all three Euler angles. See Holstein, H., Classical Mechanics, N.Y., (1950) (Addison-Wesley).

In locating desired crystal cuts for surface acoustic wave device applications, the concern in the prior art is to find a crystal orientation which has good coupling between the voltage on the electrodes and acoustic wave in the crystal itself, low beam steering, and good temperature stability. This criterion was used to generate a theoretical tabulation of surface acoustic wave properties at various orientations for a variety of surface wave materials and particular crystal cuts of interest. This tremendous work was undertaken by Slobodnik et al and can be found in Microwave Acoustic Handbook 1A and 2, Air Force Cambridge Research Labs, October 1973 and October 1974.

In 1985 Peter V. Wright disclosed his discovery of the natural single phase unidirectional transducer, "The Natural Single Phase Unidirectional Transducer, A New Low Loss SAW Structure", 1985 Ultrasonics Symposium Proceedings, pp. 58-63. Wright found that by selecting crystal cuts using a criterion in addition to and not considered by Slobodnik et al, he was able to introduce a unidirectionality into SAW transducers employing 2 electrodes per wavelength. The unidirectionality is the direct result of introducing a separation between the centers of transduction and reflection. The desired separation, as set forth in U.S. Pat. No. 4,599,587, is 45°. Wright's discovery subsequently led to U.S. Pat. No. 4,670,681, issued to Wright on June 2, 1987 and U.S. Pat. No. 4,670,680, issued to Andle on June 2, 1987. In U.S. Pat. No. 4,670,681, Wright disclosed a crystal cut of Quartz suitable for natural single phase unidirectional transducer applications. In U.S. Pat. No. 4,670,680, Andle disclosed a second crystal cut of Quartz suitable for natural single phase unidirectional transducer applications.

The inventors have discovered that a Lithium Tantalate crystal having a cut defined by the Euler angles of lambda equal about 0°, mu equal about 90° and theta equals about plus 141.25°, an orientation which has not been heretofore disclosed, provides the needed advantages as set forth above when electrodes are placed on a Lithium Tantalate crystal. Additionally, the discovered crystal cut combines the criterion for implementation of natural single phase unidirectional transducers with an increased coupling between the potential on the electrodes and the surface waves in the crystal. This advantage of increased coupling allows for the implementation of SAW devices with fractional bandwidths larger than those which can be implemented using the crystal cuts disclosed in U.S. Pat. Nos. 4,670,680 and 4,670,681. It also allows the construction of a two electrode per wavelength transducer with a desired symmetrical input conductance function and a flat susceptance region. See U.S. Pat. No. 4,599,587, issued July 8, 1986 and entitle Impedance Element for a detailed description of the desired conductance and susceptance.

SUMMARY OF THE INVENTION

Thus it is an object of the present invention to provide a Lithium Tantalate crystal having a substantially planar surface defined by the Euler angles lambda equal about 0° and mu equal about 90°, and the direction of propagation defined by the angle theta equal about plus 141.25° with substantial advantages over crystal cuts previously disclosed in the prior art. These advantages include a separation in the centers of transduction and reflection of approximately 45° as well as an increased coupling between the potential on the electrodes and the waves within the crystal.

It is also an object of the present invention to form a surface acoustic wave device comprised of interdigitated electrodes on the planar surface of the Lithium Tantalate crystal having a planar surface defined by the Euler angles lambda equal about 0° and mu equal about 90°, and the direction of propagation defined by the Euler angle theta equal about plus 141.25° which has a unidirectional propagation characteristic.

It is still a further objective of the present invention to provide the crystal with Euler angles of lambda equal about 0°, mu equal about 90° and theta equal about plus 141.25° in the form of a wafer for constructing surface acoustic wave devices.

DESCRIPTION OF THE PREFERRED EMBODIMENT

The newly discovered crystal cut with the Euler angles lambda equal about 0° and mu equal about 90° and the wave propagation direction theta equal about plus 141.25° on a Lithium Tantalate crystal provides improved performance of surface acoustic wave (SAW) devices. Specifically, the newly discovered crystal cut introduces a separation between the centers of transduction and reflection of approximately 45°, the desired separation as set forth in U.S. Pat. No. 4,599,587 entitled Impedance Element. This separation allows for the realization of SAW devices employing natural single phase unidirectional transducers with broader bandwidths than the previously disclosed Quartz crystal cuts. See U.S. Pat. Nos. 4,670,680 and 4,670,681.

There are many different types of Lithium Tantalate crystal substrates which are usually cut in the form of wafers which are thin slices having two substantially planar surfaces with at least one of the planar surfaces cut with a particular orientation that gives a cut having desired features including temperature stability of frequency and delay, velocity, coupling coefficient, and the like. The surface of the crystal on which the electrodes are to be placed is made flat and smooth before the electrodes are placed upon it.

SAW devices are used for a large number of applications including impedance elements, resonators, coupled resonator filters and the like. It is important that the crystal be cut such that good coupling exists between the voltage on the electrodes and the acoustic waves in the crystal itself. Low beam steering and good temperature stability are advantageous. The orientations for surface acoustic wave propagation for any given crystal are completely defined by the Euler angles lambda ($\lambda$), mu ($\mu$), and theta ($\theta$). The first two angles, lambda and mu, define the crystal cut and the third angle, theta, defines the direction of acoustic wave propagation on that cut. Thus, acoustic wave propagation orientation in the crystal is defined by a unique set of Euler angles. Various surface acoustic wave propagation properties exist at various orientations for a variety of surface wave materials in particular crystal cuts of interest. These properties include velocity, coupling coefficient, electromechanical power flow angle magnitude and phase of the free surface mechanical displacements and the electric surface potential. In addition, other properties include the temperature coefficient of delay, spurious bulk responses, diffraction characteristics, dielectric constants and the like.

Figure 1:
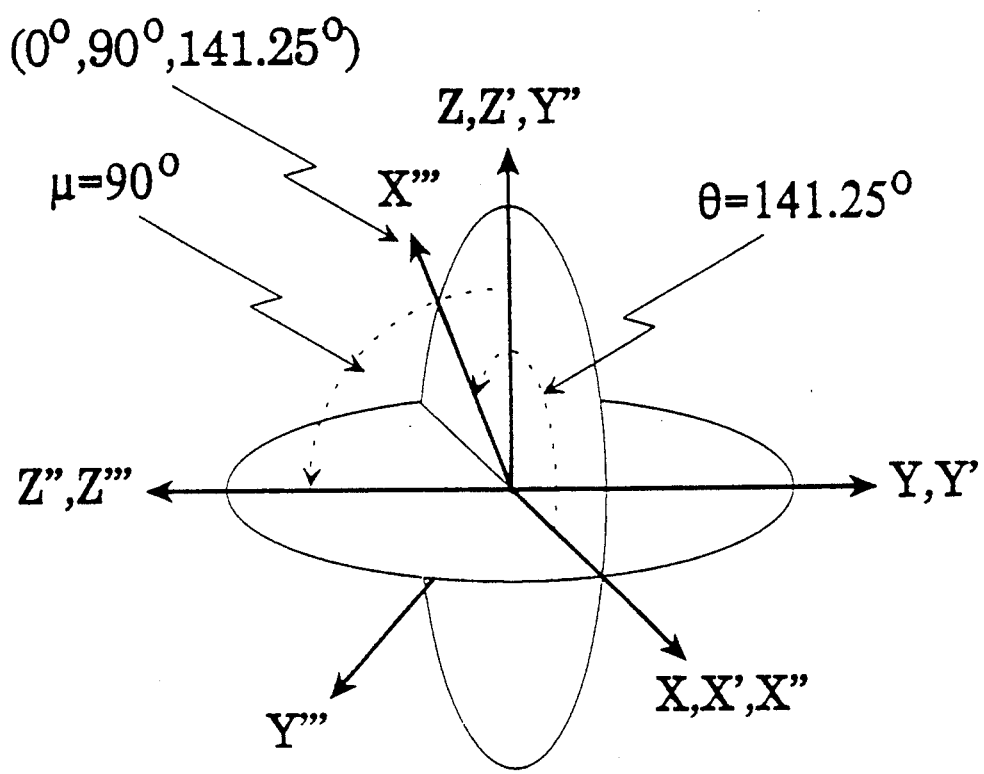
FIG. 1 is a representation of the Euler angles for a disclosed cut of Lithium Tantalate Crystal with Euler angles of lambda equal 0° and mu equal 90° and the direction of propagation Euler angle theta equal plus 141.25°.

FIG. 1 illustrates the Lithium Tantalate crystal having a surface defined by the Euler angles lambda ($\lambda$) equal about 0° and mu ($\mu$) equal about 90° and theta ($\theta$) equal about plus 130° to about plus 150° and preferably 141.25°. The crystal cut is defined using the three Euler angles as follows. The first angle, lambda, is a positive rotation, as defined by the right hand rule, about the Z-axis resulting in new axis X', Y', and Z'. For the cut illustrated, lambda is 0° and so the new axes X', Y', and Z' are the same as the original axes X, Y, and Z. The second angle, mu, is a positive rotation about the X' axis, resulting in the new axes X'', Y'', and Z''. For the cut illustrated, mu is 90° and so the new axes X'', Y'', Z'' are the same as the previous axes X', Z' and Y', respectively. The third and final angle, theta, is a rotation about the Z'' axis, resulting in the axes X''', Y''', and Z'''. For the cut illustrated, theta is 141.25° and the new axis Z''' is the same as the Z'' axis. The propagation direction is defined by the Euler angles to be in the direction of the X''' axis.

Figure 2:
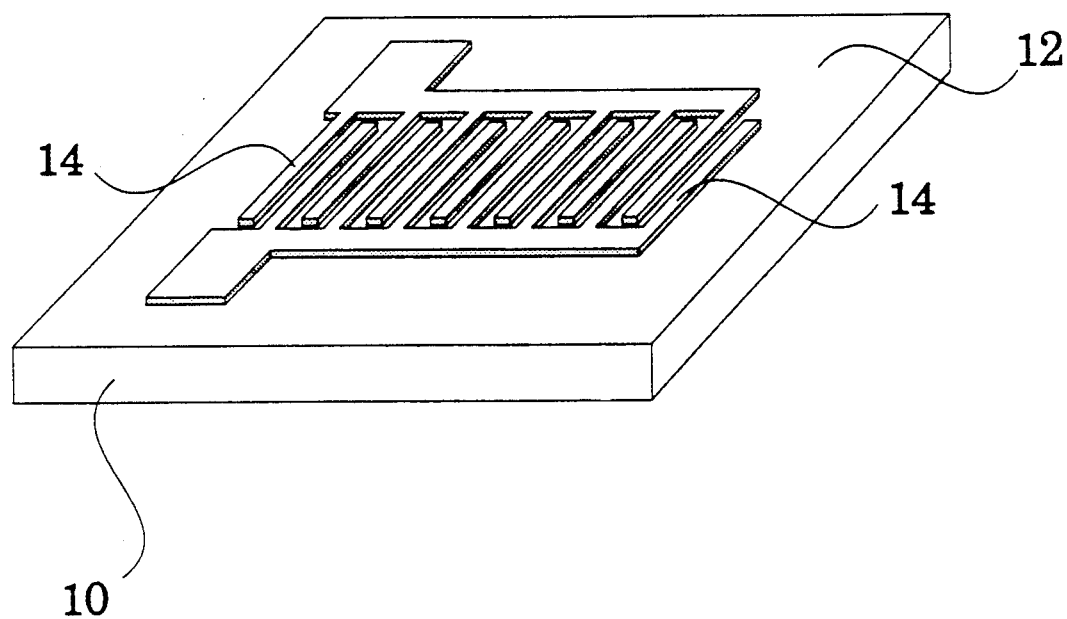
FIG. 2 illustrates a perspective view of a surface acoustic wave interdigital transducer on the disclosed cut of Lithium Tantalate crystal with the Euler angles of lambda equal 0° and mu equal 90° and the direction of propagation Euler angle theta equal plus 141.25°.

FIG. 2 illustrates the Lithium Tantalate crystal wafer 10 with the novel acoustic wave propagation orientation on the cut of about plus 141.25° and, as an example but not restricted to, a transducer with two electrodes 14 per wavelength placed on the crystal's planar surface 12 to form the novel acoustic wave device of the present invention which has unidirectional wave propagation characteristics. The unidirectional device shown in FIG. 2 is formed by cutting a wafer 10 with Euler angles lambda equal about 0°, mu equal about 90°, and theta equal about 141.25° from a Lithium Tantalate crystal, polishing the surface of said wafer to obtain a substantially planar surface, and depositing two metallic interdigitated electrodes 14 per wavelength on the wafer's planar surface 12. Such a transducer on the disclosed crystal cut has a symmetric conductance function and can have a flat susceptance region. This characteristic can be obtained because the separation of the centers of the transduction and reflection on the newly discover orientation is approximately 45°, the desired separation as set forth in U.S. Pat. No. 4,599,587 entitled Impedance Element.

Thus, a Lithium Tantalate crystal has been disclosed which has substantially planar surfaces defined by particular Euler angles including lambda equal about 0°, and mu equal about 90° with a wave propagation direction theta equal about plus 130° to about plus 150° and optimally about plus 141.25°. The novel orientation allows a good coupling coefficient between the voltage on the electrodes placed thereon and the acoustic waves in the crystal itself and has low beam steering and good temperature stability and allows a unidirectional transducer to be constructed.

While the invention has been described in connection with a preferred embodiment, it is not intended to limit the scope of the invention to the particular form set forth but, on the contrary, it is intended to cover such alternatives, modifications and equivalents as may be included in the spirit and scope of the invention as defined by the appended claims. For example, due to crystal symmetry, the Lithium Tantalate cut defined by Euler angles (lambda, mu, theta) equal about (0°, +90°, +141.25°) is in practice equivalent to the seven additional Lithium Tantalate crystal cuts (0°,+90°, −141.25°), (0°, −90°, +141.25°), (0°,−90°,−141.25°), (0°, +90°, +38.75°), (0°, +90°,−38.75°), (0°, −90°, +38.75°), and (0°, −90°, −38.75°). Additionally, said modifications are intended to include variations of the Euler angles about the disclosed values which will occur to those skilled in the art.

We claim:

1. A Lithium Tantalate crystal for acoustic wave propagation having a substantially planar surface defined by the Euler angles lambda ($\lambda$) equal about 0° and mu ($\mu$) equal about 90° and the acoustic wave propagation direction Euler angle theta ($\theta$) equal about plus 130° to about plus 150°, or equivalents.

2. A Lithium Tantalate crystal as set forth in claim 1, in which the acoustic wave propagation direction Euler angle theta ($\theta$) preferably equals about plus 141.25°.

3. A unidirectional surface acoustic wave device comprising, interdigitated electrodes on the planar surface of the Lithium Tantalate crystal defined by the Euler angles of claim 1 to obtain unidirectional transmission.

4. The device of claim 3, in which the crystal is in the form of a wafer.

5. A crystal for acoustic wave propagation comprising, a thin Lithium Tantalate plate having a crystal orientation around (1) the Z axis of said plate by an angle lambda ($\lambda$) of about 0° and (2) the X axis of said plate by angle mu ($\mu$) of about 90° and a wave propagation angle theta ($\theta$) of about plus 130° to about plus 150°, or equivalents.

6. A crystal for acoustic wave propagation as set forth in claim 5, in which angle theta ($\theta$) is preferably about plus 141.25° and equivalents.

7. A method of forming a Lithium Tantalate crystal for acoustic wave propagation comprising the steps of:
   a. forming a cut Lithium Tantalate crystal having a substantially planar surface, and
   b. defining the planar surface by the Euler angle lambda ($\lambda$) equal about 0° and mu ($\mu$) equal about 90° and the acoustic wave propagation direction Euler angle theta ($\theta$) equal about plus 130° to about 150° and equivalents.

8. A method of forming a Lithium Tantalate crystal as set forth in claim 7, defining the acoustic wave propagation direction Euler angle theta ($\theta$) preferably at about 141.25° and equivalents.

9. A method of forming a unidirectional surface acoustic wave device comprising the steps of:
   a. forming a cut Lithium Tantalate crystal having a substantially planar surface,
   b. defining said crystal by the Euler angles lambda ($\lambda$) equal about 0°, mu ($\mu$) equal about 90° and theta ($\theta$) equal about plus 130° to about plus 150°, or equivalents, and
   c. placing interdigitated electrodes on said planar surface, to propagate acoustic waves in the direction theta ($\theta$) equal about plus 130° to about plus 150°, or equivalents, to obtain said unidirectional transmission.

10. The method of claim 9, further comprising the step of constructing said crystal in the form of a wafer.

11. The method of forming a crystal cut comprising the steps of:
   a. forming said crystal of a thin Lithium Tantalate plate, for acoustic wave propagation,
   b. rotating the crystal orientation of said plate around (1) the Z axis of said plate by an angle lambda ($\lambda$) equal about 0° and (2) the X axis of said plate by an angle mu ($\mu$) equal about 90°, and
   c. designating the acoustic wave propagation direction in said crystal as an angle theta ($\theta$) equal about plus 130° to about plus 150°, or equivalents.

12. The method of forming a crystal cut as set forth in claim 11, in which the angle theta ($\theta$) preferably equals about plus 141.25° or equivalents.

* * * * *